(12) United States Patent
Crocker

(10) Patent No.: US 9,984,503 B2
(45) Date of Patent: *May 29, 2018

(54) SYSTEMS AND METHODS OF UPDATING GRAPHICAL OBJECTS

(71) Applicant: IntegrityWare, Inc., San Deigo, CA (US)

(72) Inventor: Gary Arnold Crocker, San Diego, CA (US)

(73) Assignee: IntegrityWare, Inc., San Deigo, CA (US)

(*) Notice: Subject to any disclaimer, the term of this patent is extended or adjusted under 35 U.S.C. 154(b) by 523 days.

This patent is subject to a terminal disclaimer.

(21) Appl. No.: 14/664,826

(22) Filed: Mar. 21, 2015

(65) Prior Publication Data

US 2015/0193976 A1    Jul. 9, 2015

Related U.S. Application Data

(63) Continuation of application No. 13/447,096, filed on Apr. 13, 2012, now Pat. No. 8,990,050.

(51) Int. Cl.
*G06F 17/50* (2006.01)
*G06T 17/20* (2006.01)

(52) U.S. Cl.
CPC ............. *G06T 17/20* (2013.01); *G06F 17/50* (2013.01); *G06F 17/5018* (2013.01)

(58) Field of Classification Search
CPC ...... G06T 17/20; G06F 17/50; G06F 17/5018
USPC ............................................................ 703/1
See application file for complete search history.

(56) References Cited

U.S. PATENT DOCUMENTS

| 8,411,080 B1* | 4/2013 | Zimmermann | G06T 19/20 345/419 |
| 8,990,050 B2* | 3/2015 | Crocker | G06F 17/50 703/1 |
| 2002/0191863 A1* | 12/2002 | Biermann | G06T 7/80 382/284 |

* cited by examiner

*Primary Examiner* — Dwin M Craig

(57) ABSTRACT

Systems and methods of updating graphical objects are disclosed. The methods and systems receive polygonal data which describe discrete points on an object. A control mesh and a smoothed version of the control mesh are simultaneously displayed. When the control mesh is edited, the smoothed version is automatically updated by smoothing only a portion of the edited control mesh to generate a smoothed section, and replacing a portion of the smoothed version with at least a selected portion of the smoothed section.

17 Claims, 14 Drawing Sheets

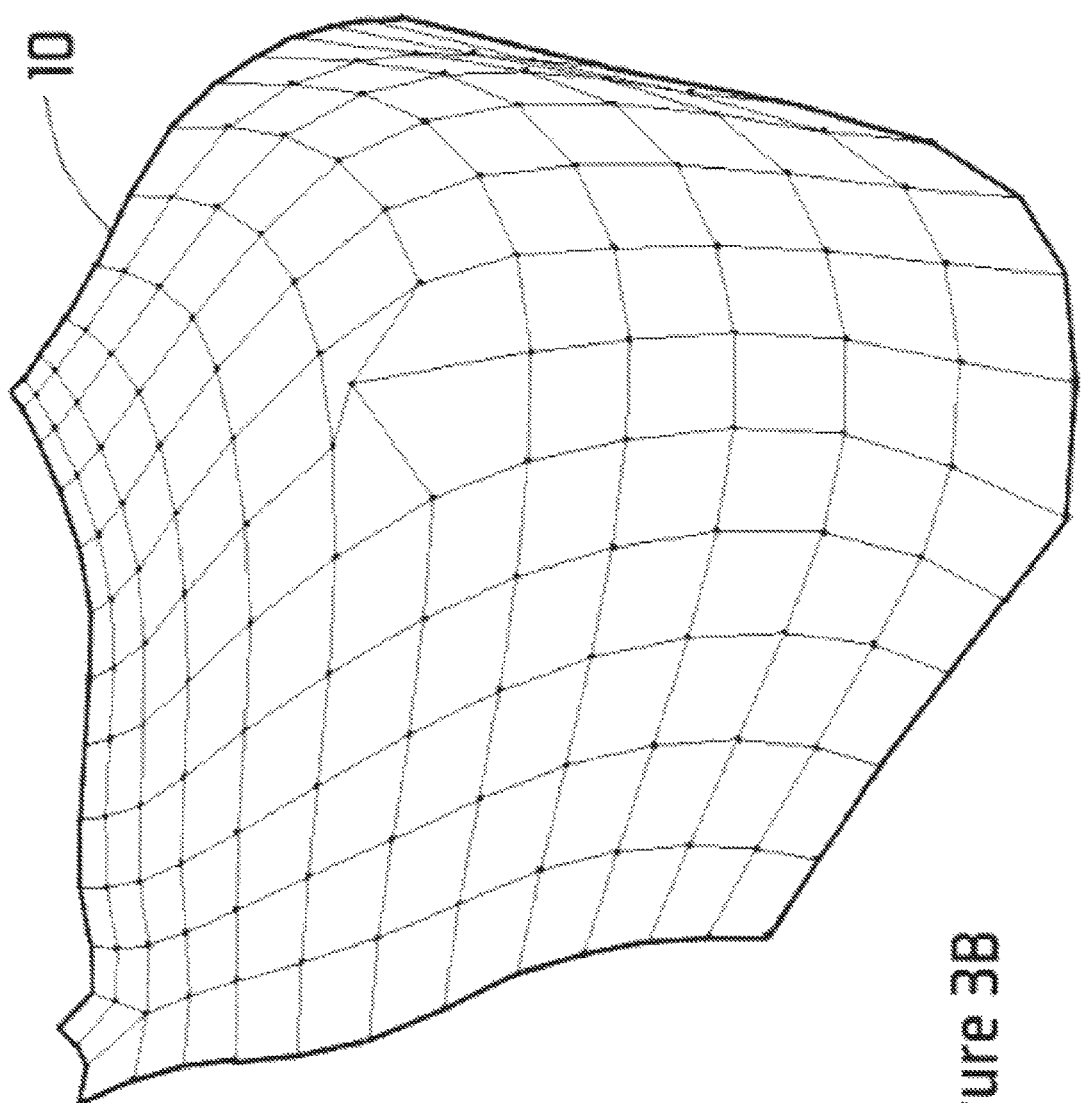

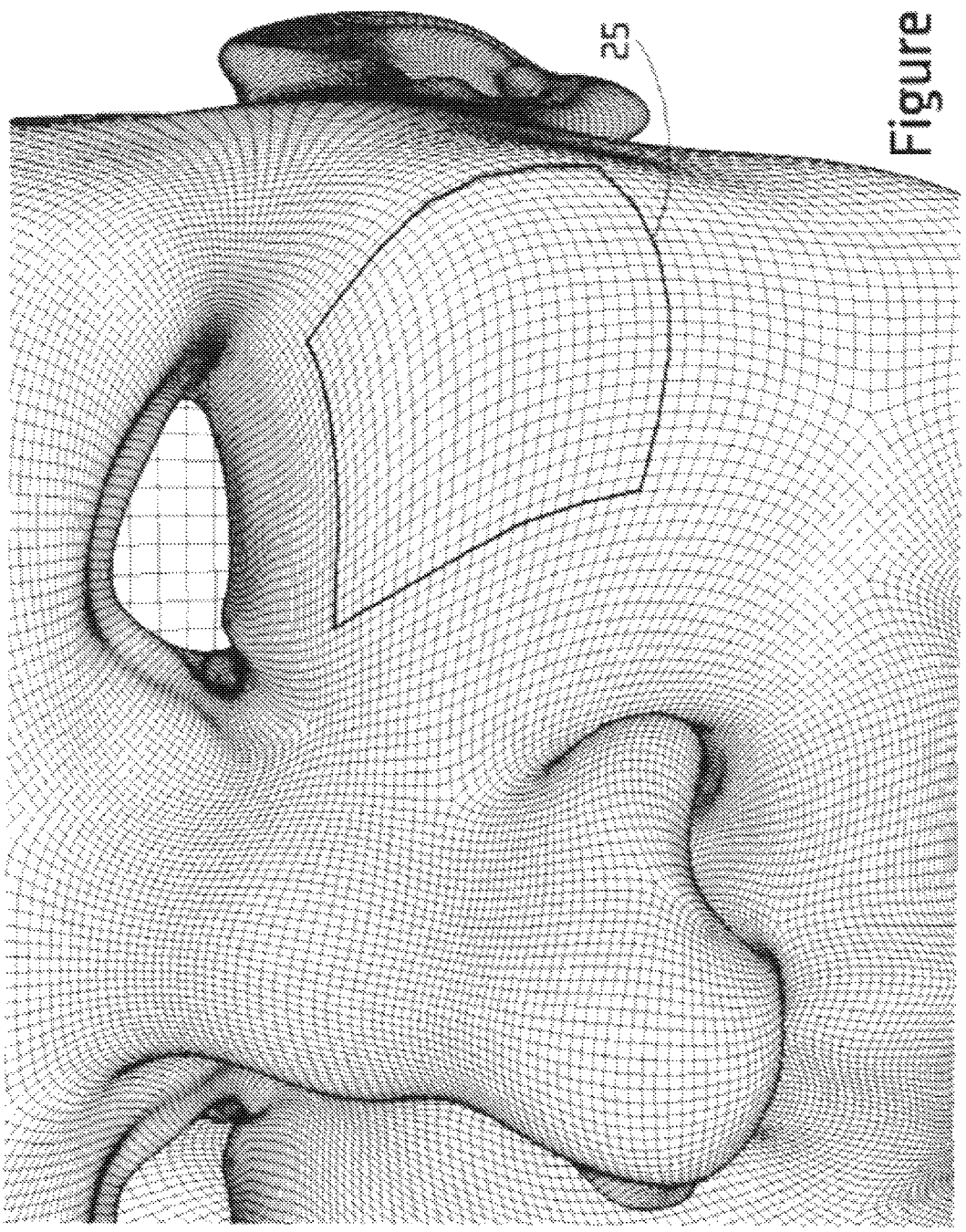

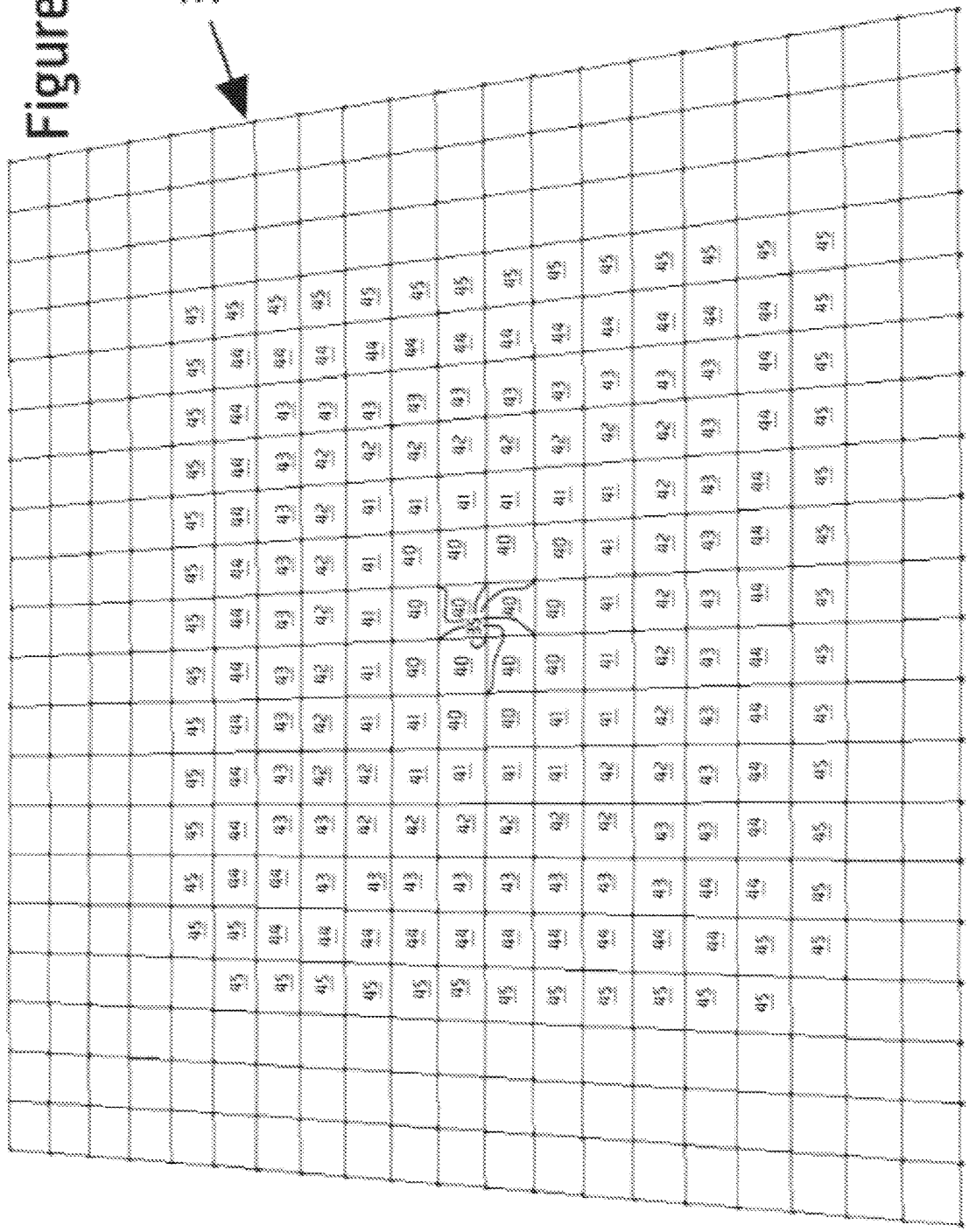

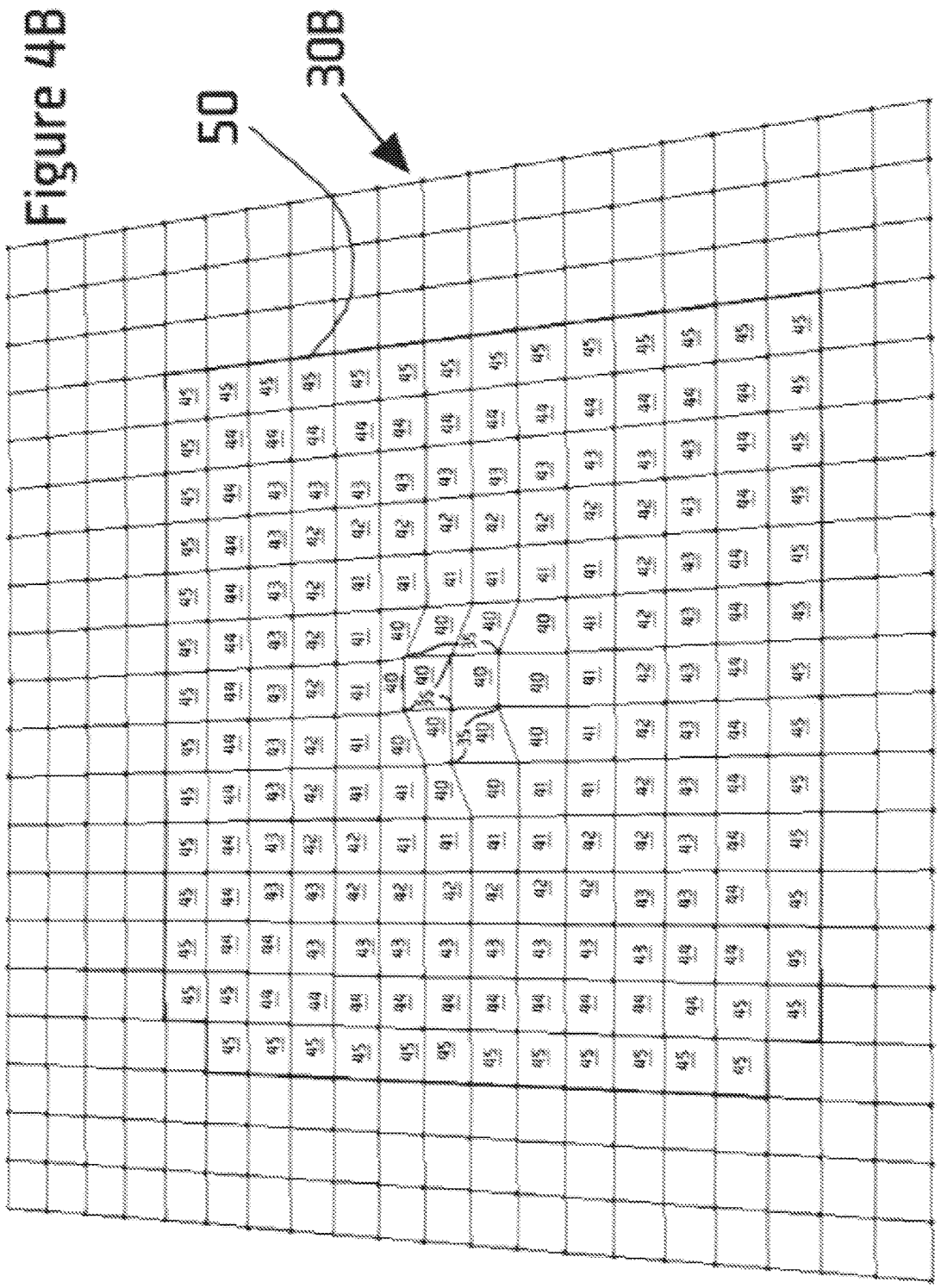

90A

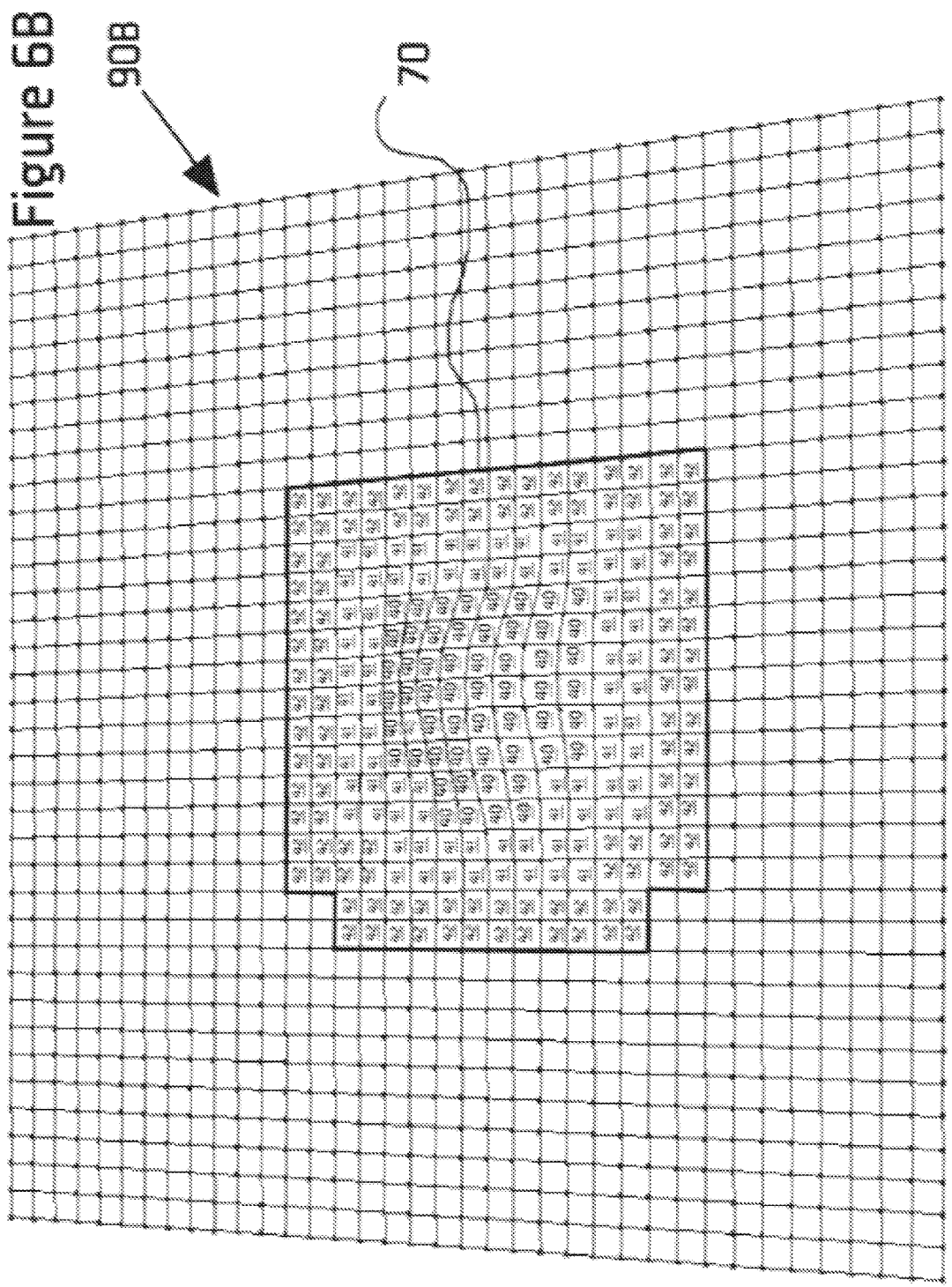

SYSTEMS AND METHODS OF UPDATING GRAPHICAL OBJECTS

CROSS REFERENCE TO RELATED APPLICATIONS

This application is a continuation of application Ser. No. 13/447,096, filed Apr. 13, 2012, now issued U.S. Pat. No. 8,990,050, entitled "Systems and Methods of Updating Graphical Objects," which is incorporated herein by reference.

BACKGROUND

Field

The described technology relates to systems and methods of updating graphical information representing a polygonal data object.

Description of the Related Technology

Polygonal model data is created with, for example, a 3-D CAD software tool by, for example, a designer. The polygonal model or polygonal mesh includes discrete data points describing one or more surfaces or objects. Polygonal models are convenient for design work at least because they define the surface or object with a degree of detail convenient for the designer to work with. The shape of the surface or object is defined by the data points, and the surface between the data points is perceived, but is not necessarily represented in the data. This allows for the CAD system to function quicker because of a significantly reduced data set representing the surface or object, while providing the designer enough detail to manipulate to achieve a desired design.

The polygonal data may be edited by a designer according to the designer's purposes. For example, the designer may add features to the object represented by the polygonal data using mesh operations. In addition, to create smooth, natural looking objects, a smoothing algorithm may be used to modify the polygonal data. For example, a Catmull-Clark algorithm or a Loop subdivision algorithm may be performed on the polygonal data. The smoothing algorithm modifies the polygonal data by, for example, adding vertices and repositioning existing vertices. Thus, the smoothing algorithm generates a modified object.

Typically the polygonal data is shown on a display with the smoothed object. As the designer edits the polygonal data in the design process, the smoothed object is updated to show the result of the designers edit. The polygonal data object includes a number of geometries, such as vertices, edges, and faces. In some applications, if the number of geometries is large enough, when the polygonal data is edited, the process of graphically representing the smoothed object can overload system resources such that the designer has to wait an undesirably long time for the graphical updating process to finish. Such waiting is wasteful and interrupts the workflow of the designer, and accordingly lowers productivity.

SUMMARY OF CERTAIN INVENTIVE ASPECTS

One aspect is a method of producing an electronic geometric model. The method comprises accessing electronic data comprising polygonal data defining a control mesh of polygonal data points, performing a smoothing algorithm on the control mesh to generate a smoothed mesh, and displaying the smoothed mesh. In response to an indication from a user, wherein the indication indicates that a portion of the control mesh is to be modified, the method also includes determining a portion of the control mesh for smoothing, the determined portion being less than the entire control mesh, performing a smoothing algorithm on the determined portion to generate a smoothed section, selecting a portion of the smoothed section, and replacing a portion of the smoothed mesh with the selected portion of the smoothed section. The method also includes redisplaying the smoothed mesh.

BRIEF DESCRIPTION OF THE DRAWINGS

FIGS. 3A-3G are illustrations of control and smoothed meshes at various stages in a method of generating a smoothed portion.

FIGS. 4A and 4B are illustrations of a control mesh before and after certain vertices are moved.

FIGS. 6A and 6B are illustrations of the smoothed mesh before and after movement of the vertices.

DETAILED DESCRIPTION OF CERTAIN INVENTIVE EMBODIMENTS

Various aspects and features of methods and systems are described herein with reference to the accompanying drawings, which show certain exemplary embodiments. The described embodiments may be modified in various ways, without departing from the spirit or scope of the present invention or inventions. In addition, the described embodiments have multiple features and aspects, no single one of which is solely responsible for the desirable characteristics of the embodiments. Furthermore, no single feature or aspect is essential to practicing the methods and systems described herein. Furthermore, various features and aspects of the embodiments may be combined in embodiments not specifically described.

Various inventive aspects of certain embodiments of methods and systems for generating and graphically rendering smoothed polygonal data objects are discussed. The methods and systems access polygonal data which describe discrete points of a geometric object. The methods and systems use a smoothing algorithm, such as, but not limited to, a Catmull-Clark or Loop subdivision algorithm to smooth the geometric object. The smoothed version of the polygonal data may be simultaneously displayed with a representation of the polygonal data. A designer may modify the polygonal data using a CAD software tool. As the polygonal data is modified, the smoothed version may be automatically updated in response to the modification.

Figure 1:
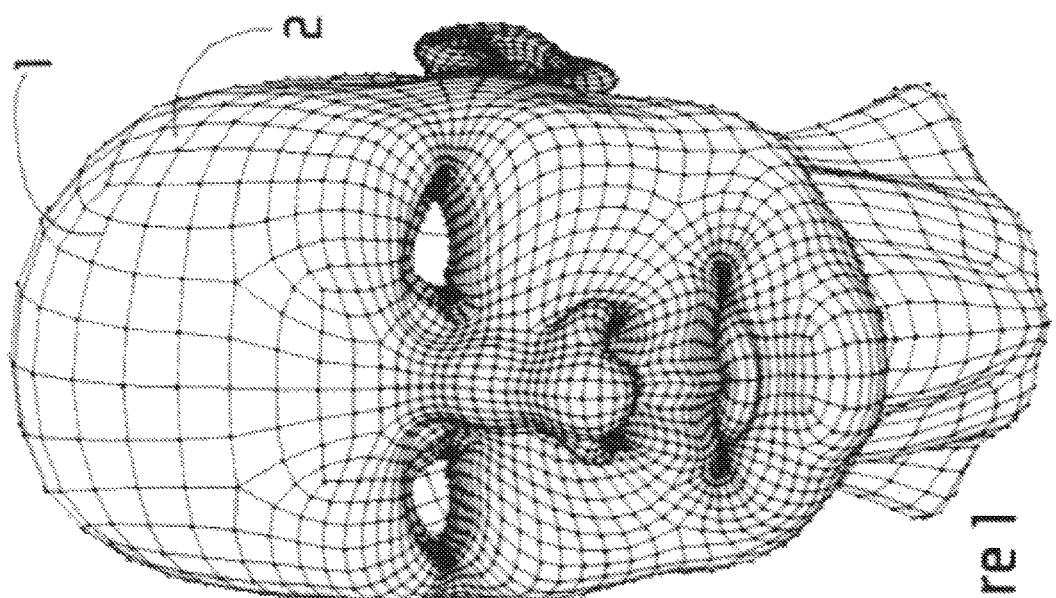
FIG. 1 is an illustration of a control mesh and a corresponding smoothed mesh.

For example, the methods and systems may access electronic data which describes polygonal data object 1, such as that represented in FIG. 1. In this example, the polygonal data object 1 is a control mesh. Also shown is smoothed mesh 2, which is generated by a smoothing algorithm. As shown, the control mesh 1 has fewer geometries (e.g. faces, edges, and vertices) than the smoothed mesh 2.

Figure 2:
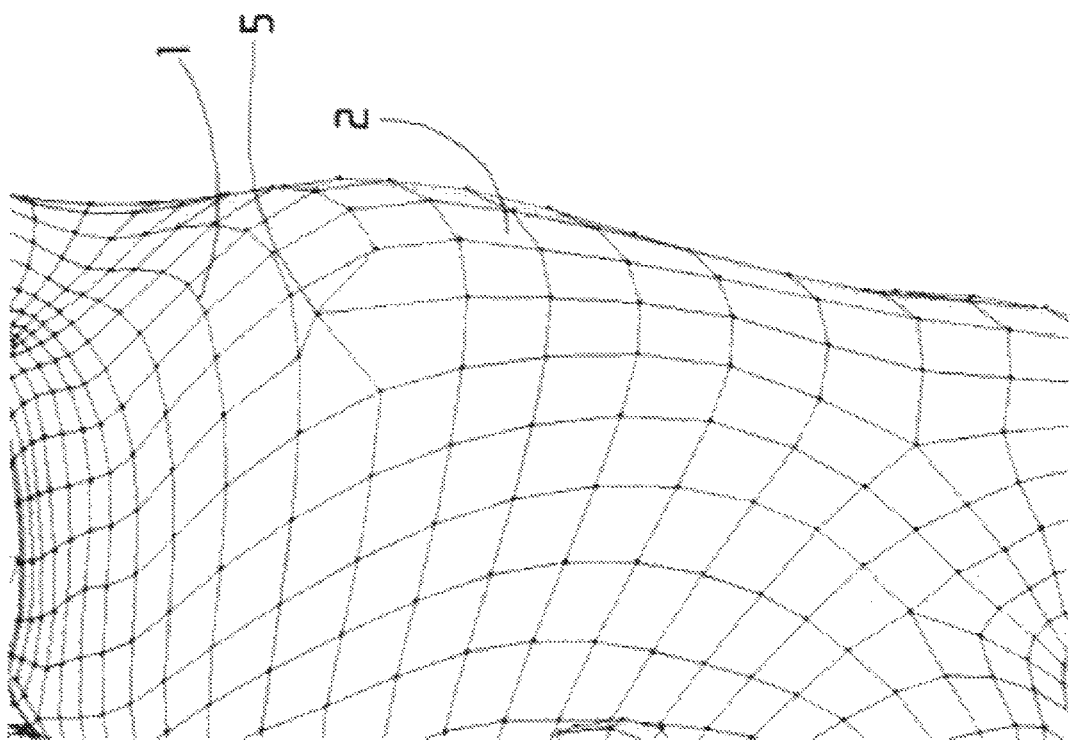
FIG. 2 is an illustration of a control mesh having a moved vertex and a corresponding smoothed mesh.

In the example of FIG. 1, a large number of geometries are used to represent a head. When the designer modifies a geometry in the control mesh 1, the computer system automatically updates the smoothed mesh 2, so that the designer can substantially immediately see the impact of the modification of the control mesh 1 on the smoothed mesh 2. As shown in FIG. 2, vertex 5 of control mesh 1 has been moved. In response, the computer system has updated the smoothed mesh 2, such that near the moved vertex 5, the smoothed mesh 2 is correspondingly modified. Such updating of the smoothed mesh 2 is accomplished by the computer system performing the smoothing algorithm on the control mesh 1. Because the control mesh 1 includes the modification made by the designer, the modification is represented in the updated smoothed mesh 2.

Conventionally, upon each modification in the control mesh 1, as shown in FIG. 1, the computer system performs the smoothing algorithm on the entire control mesh 1 and replaces the smoothed mesh 2 with the result. For polygonal data of sufficiently large size, performing the smoothing algorithm and rendering the smoothed mesh 2 may enough time that the updating is not substantially immediate, but instead, the designer must wait.

In certain aspects of the system and methods described herein, to update the smoothed mesh 2 in response to a modification of the control mesh 1, only a portion of the control mesh 1 is operated on by the smoothing algorithm, and only a portion of the smoothed mesh 2 is revised.

In the example shown in FIG. 2, the change in the smoothed mesh 2 is limited to an area near the modified vertex 5 in the control mesh 1. Geometries in the smoothed mesh 2 which are some distance away from the modified portion are entirely unchanged. Accordingly, performing the smoothing algorithm on much of the control mesh 1 results in smoothed mesh data which is identical to the smoothed mesh data prior to modification, and is, therefore, unnecessary.

In some embodiments, in response to the modification of the control mesh 1, the computer system selects a portion of the control mesh 1 upon which the smoothing algorithm operates. The smoothing algorithm generates a smoothed section by smoothing the selected portion. The computer system subsequently selects a portion of the smoothed section for inclusion in the smoothed mesh 2. The selected portion of the smoothed section is used to replace data in a portion of the data of the smoothed mesh 2. The remaining portions of the smoothed mesh 2 are not regenerated because they are not changed by the modification in the control mesh 1.

Figure 3A:
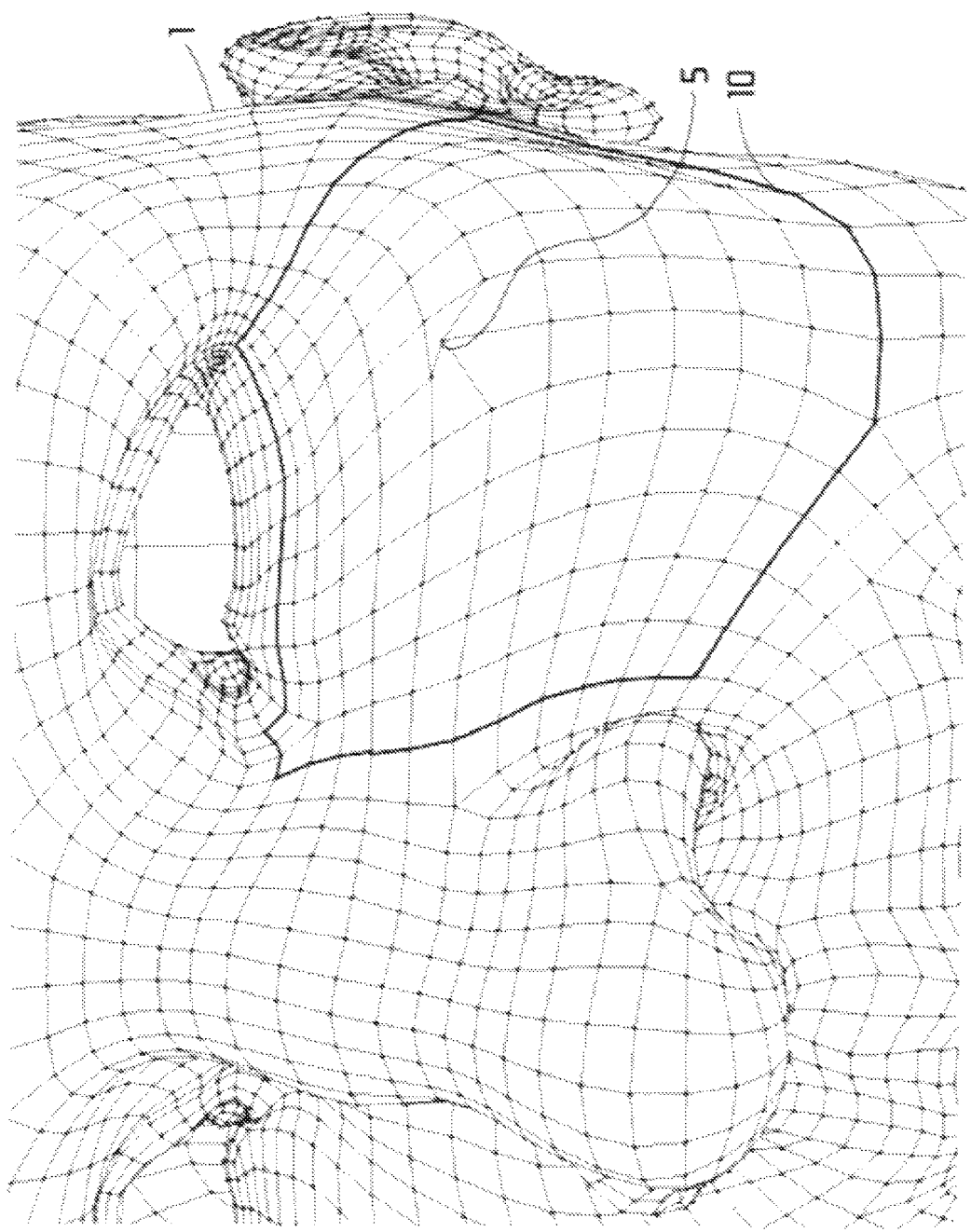

An example is shown in FIGS. 3A-3F. In FIG. 3A, the vertex 5 of control mesh 1 has been modified. In response to the modification of the control mesh 1, the computer system determines a portion 10 of the control mesh 1 upon which the smoothing algorithm is to operate. Various methods may be used to determine the portion 10. Certain examples are described below. FIG. 3B is a graphical representation of the determined portion 10 of the control mesh 1. As shown, the determined portion 10 is a small fraction of the entire control mesh 1.

Figure 3C:
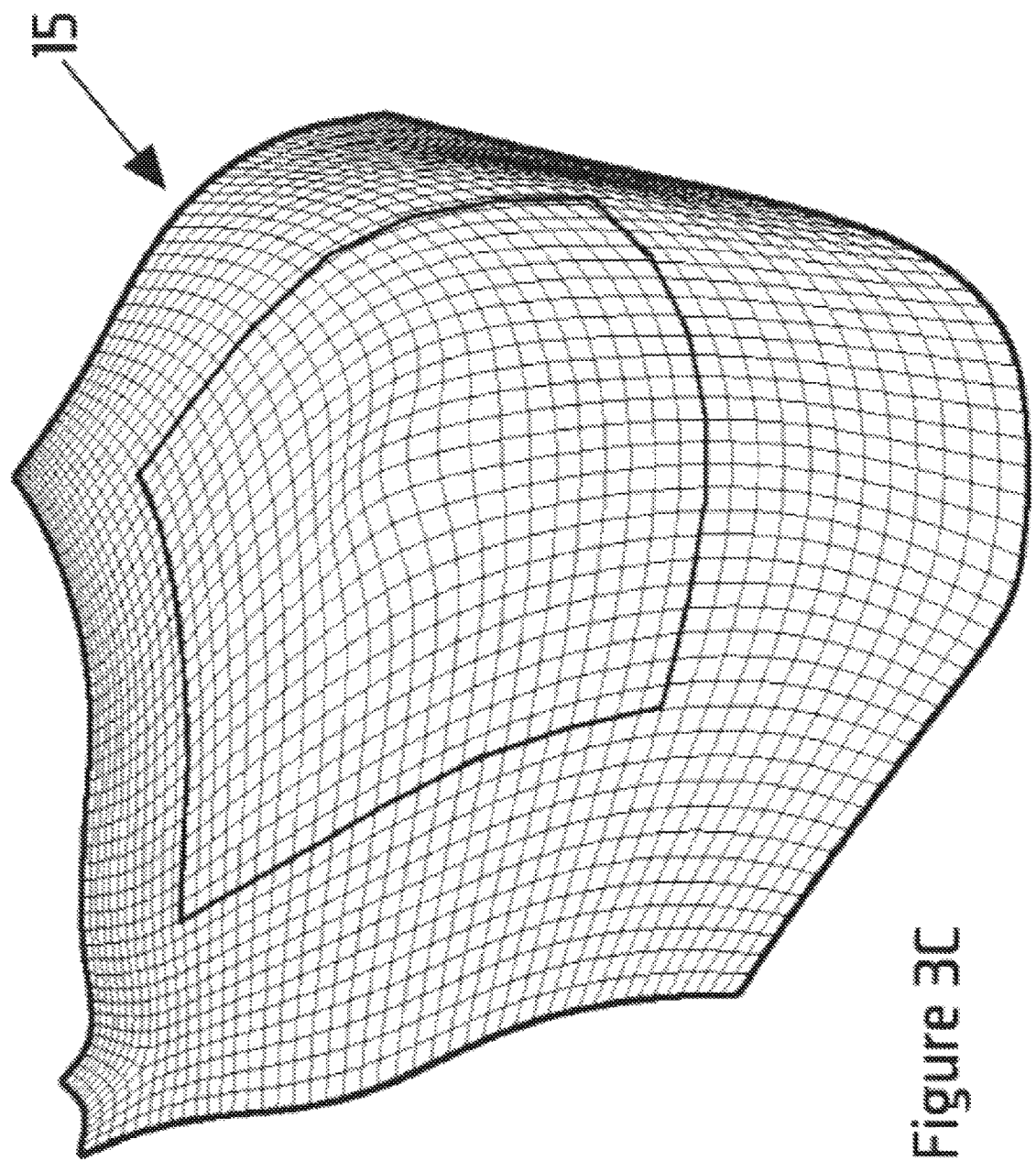
Figure 3D:
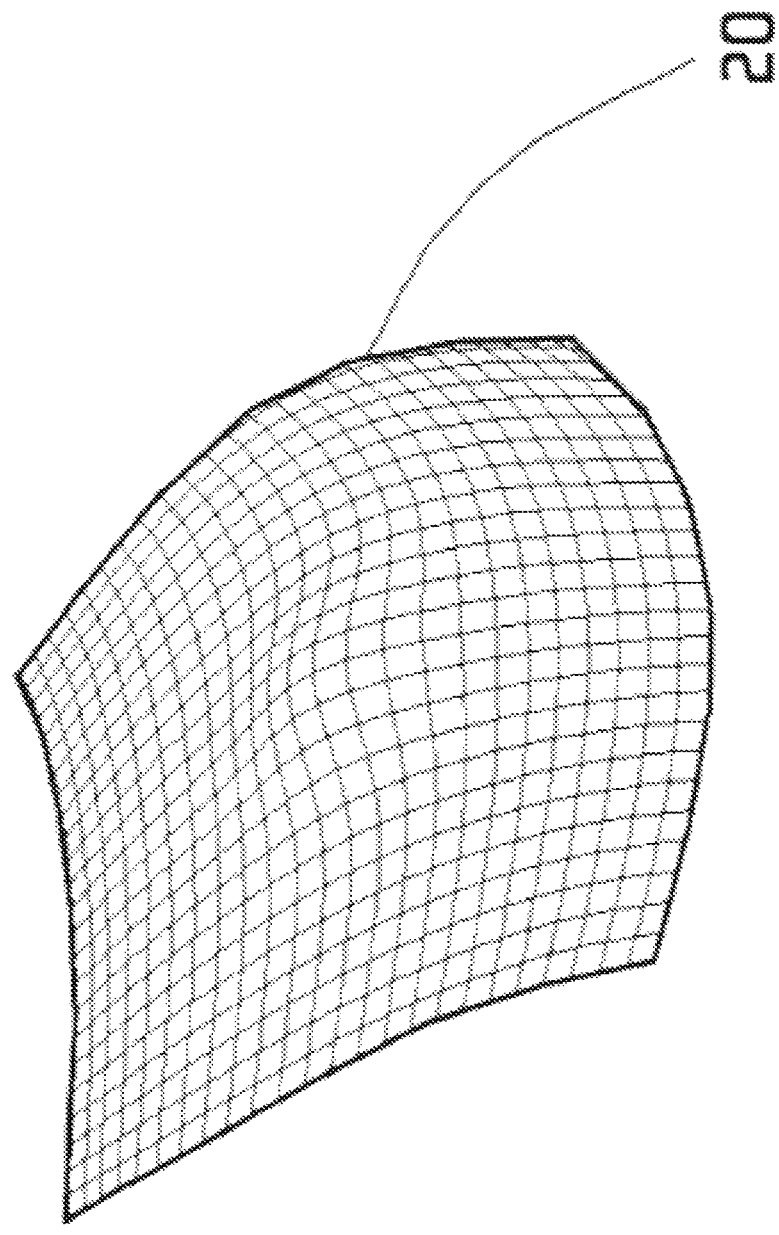

The computer system generates a smoothed section 15 by operating on the portion 10 with the smoothing algorithm. FIG. 3C is a graphical representation of the smoothed section 15 generated by the smoothing algorithm. The computer system subsequently selects a portion 20 of the smoothed section 15 for inclusion in the smoothed mesh 2. Various methods may be used to determine the portion 20. Certain examples are described below. FIG. 3D is a graphical representation of the selected portion 20.

The computer system identifies a section 25 of the previous unupdated smoothed mesh 2 which corresponds to the portion 20 of the smoothed section 15 of the control mesh 1.

FIG. 3E is a graphical representation of the previous smoothed mesh 2 showing the section 25.

Figure 3F:
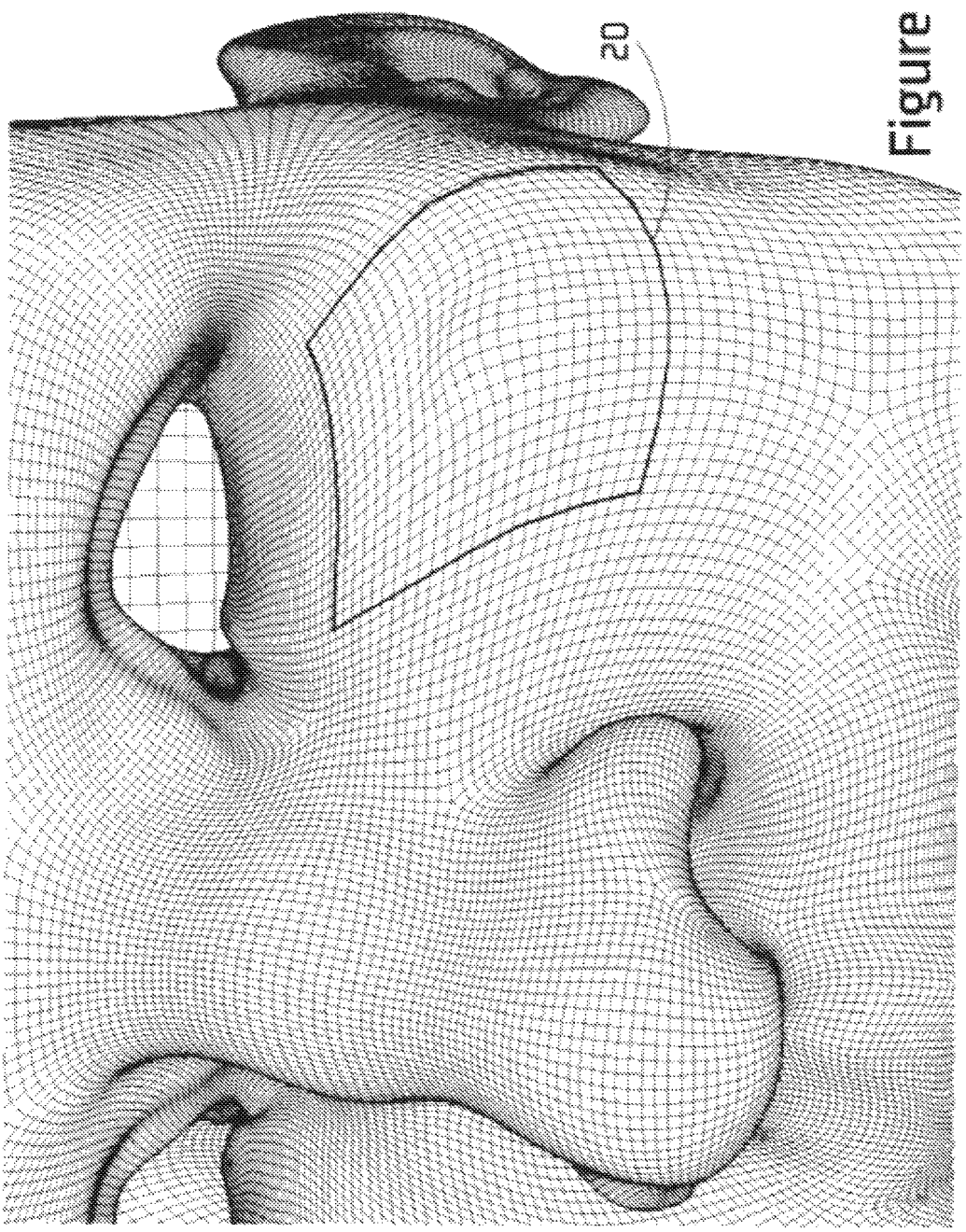
Figure 3G:
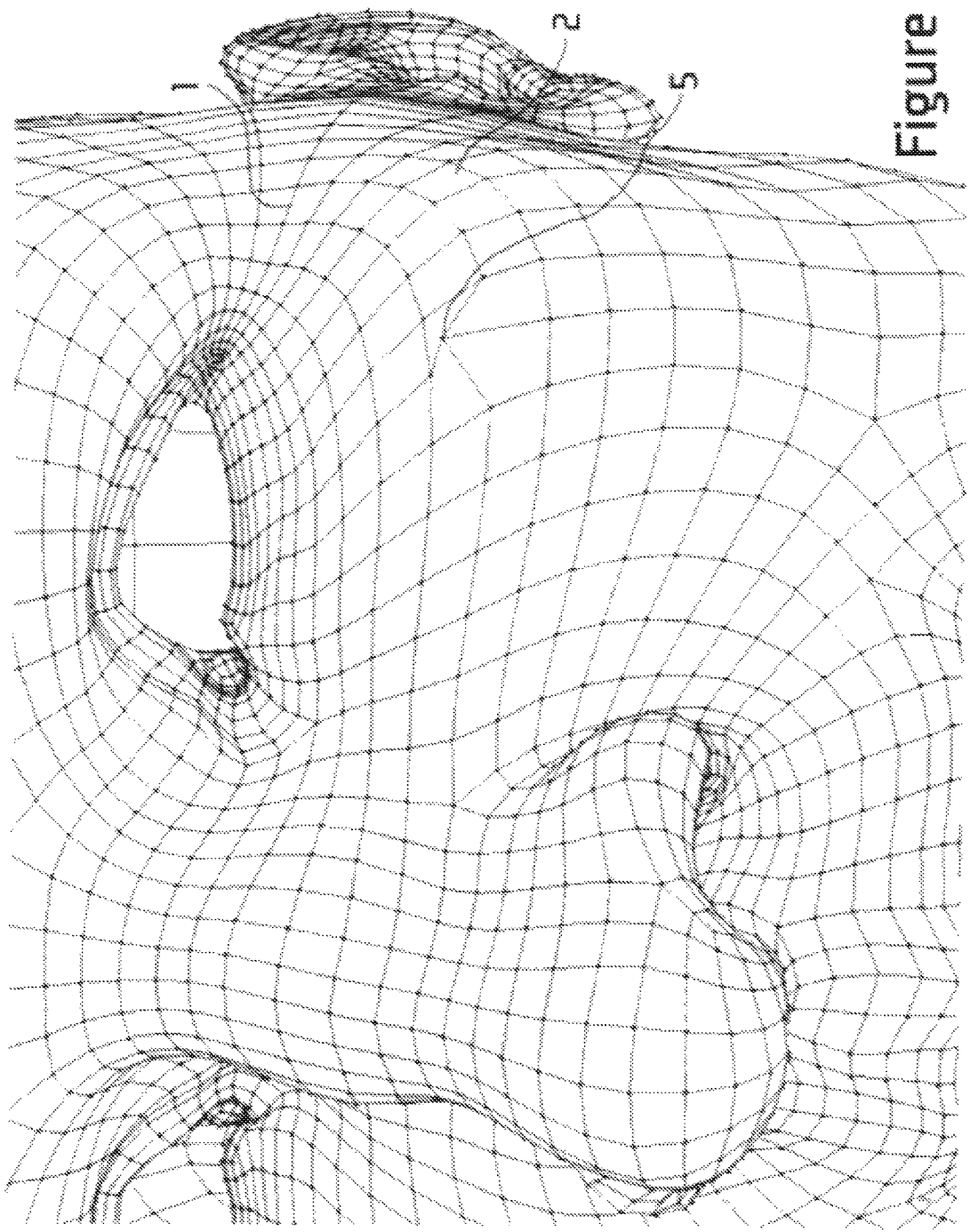

The computer system then replaces section 25 with portion 20, as shown in FIG. 3F. The result, as shown in FIG. 3G, is that both the control mesh 1 and the smoothed mesh 2 reflect the modification of vertex 5, where the rendering of the modification in the smoothed mesh 2 occurs substantially immediately because only a portion of the smoothed mesh 2 is recalculated in response to the modification of vertex 5.

As discussed above, various methods may be used by the computer system to determine the portion upon which the smoothing algorithm is to operate, such as portion 10 of FIGS. 3A and 3B. The portion should include enough of the control mesh so that, once a smoothed section is generated, the selected portion of the smoothed section includes all faces which are modified because of the modification of vertex 5. In addition, the portion should include enough of the control mesh so that the selected portion of the smoothed section can be used to replace the corresponding portion of the smoothed mesh data with a desired continuity at the boundary of the replaced portion. For example, if C0, C1, or C2 continuity is desired at the boundary, the size of the portion of the control mesh is correspondingly determined.

FIG. 4A is a graphical representation of a control mesh 30A prior to movement of vertices 35. FIG. 4B is a graphical representation of control mesh 30B showing that vertices 35 have been moved. First faces 40 are affected by the movement of the vertices 35, and are therefore included in the portion upon which the smoothing algorithm is to operate. Additional faces are also included. The additional faces may include those faces, which correspond to the faces of the smoothed mesh which the smoothing algorithm will modify as a result of the movement of the vertices 35. For example, second faces 41, which are adjacent to first faces 40 may also be included. In addition, third faces 42, which are adjacent to second faces 41 may also be included.

Additional faces may be further included so that the selected portion of the smoothed section can be used to replace the corresponding portion of the smoothed mesh data with a desired continuity at the boundary of the replaced portion. For example, if C0 continuity is desired at the boundary, fourth faces 43 may be included. If C1 continuity is desired at the boundary, fifth faces 44 may also be included. If C2 continuity is desired at the boundary, sixth faces 45 may also be included.

In some embodiments, the degree of the smoothing algorithm may be used to determine which faces to include. For example, if the smoothing algorithm is an nth degree smoothing algorithm, which uses nth degree polynomials to calculate positions of geometries, the characteristics of each face in the smoothed mesh is influenced by faces in the control mesh which are within n faces of the location in the control mesh corresponding to the location of the face in the smoothed mesh. Accordingly, for a third degree smoothing algorithm, first, second, and third faces 40, 41, and 42 may be included so that the included portion has the faces which correspond to the faces of the smoothed mesh which the smoothing algorithm may modify as a result of the movement of the vertices 35.

In addition, if maximum continuity is desired at the boundary of the replaced portion in the smoothed mesh, where the smoothed mesh is generated by the nth degree smoothing algorithm, an additional n rings are also included. In the embodiment of FIGS. 4A and 4B, fourth, fifth, and sixth faces 43, 44, and 45 are also included. Accordingly, to achieve a result identical to that which would be achieved if the entire control mesh were smoothed to generate the smoothed mesh, faces which are two times the degree of the smoothing algorithm or less from a moved vertex are included in the portion determined for smoothing. For example, if a second degree smoothing algorithm were used, faces 40, 41, 42, and 43 would be included in the determined portion.

Figure 5:
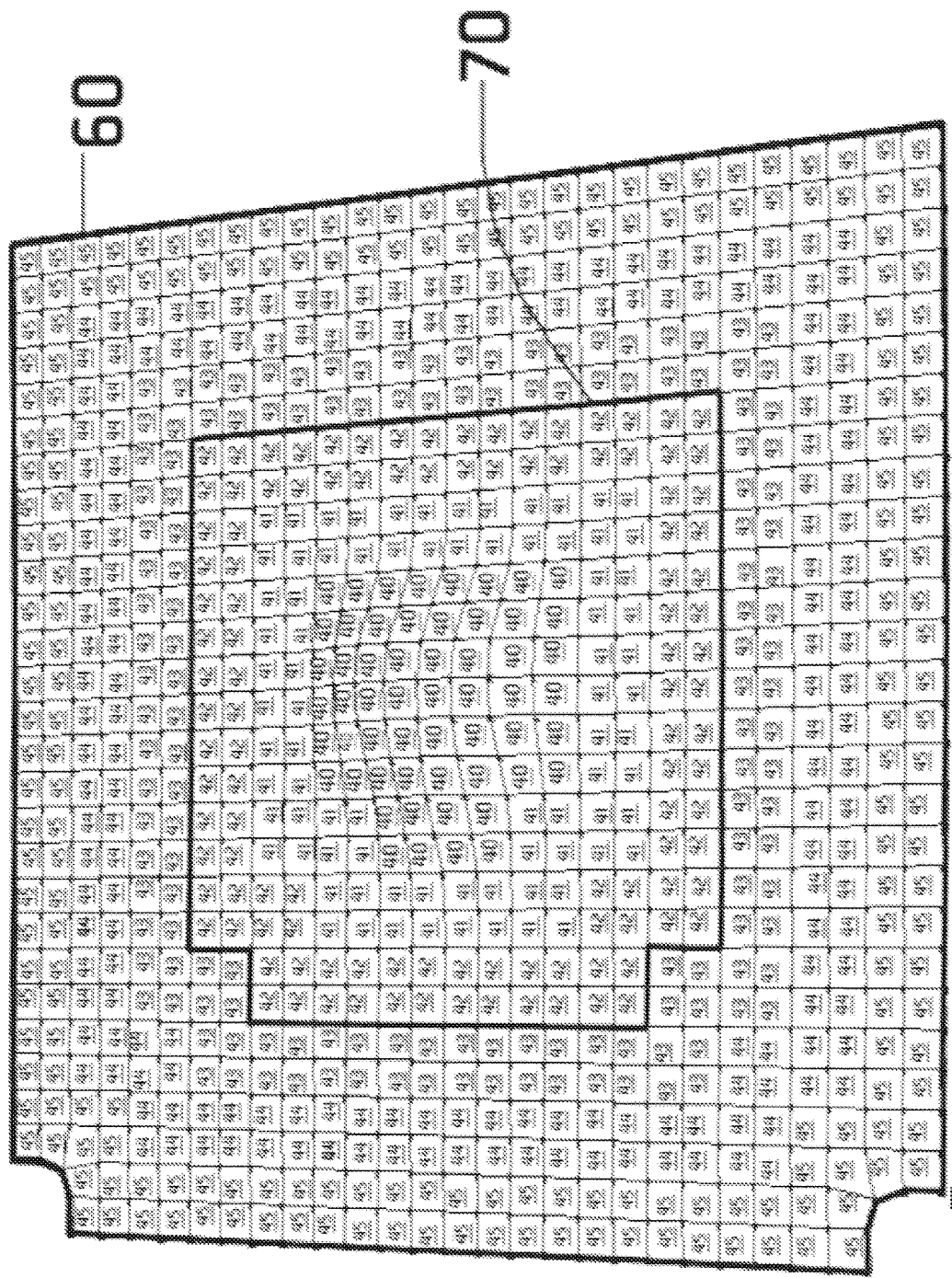
FIG. 5 is an illustration of a smoothed mesh corresponding to a portion of the mesh of FIG. 4B.

In the example of FIGS. 4A and 4B, faces 40, 41, 42, 43, 44, and 45 are determined by the computer system to be included in the portion 50 upon which the smoothing algorithm is to operate. In some embodiments the portion 50 is determined and stored for reuse if the vertices 35 are repeatedly edited. Thus, if the designer repeatedly edits a section of the control mesh, the portion 50 does not need to be recalculated for each individual edit. FIG. 5 is an illustration of a smoothed section 60 generated by the smoothing algorithm operating on portion 50 of FIG. 4B. The faces of smoothed section 60 are labeled with reference numerals of the faces of portion 50 which have corresponding locations.

The computer system selects a portion 70 of the smoothed section 60 for inclusion in the modified smoothed mesh corresponding to control mesh 30B of FIG. 4B. In some embodiments the portion 70 is determined and stored for reuse if the vertices 35 or geometries near the vertices 35 are repeatedly edited. Thus, if the designer repeatedly edits a section of the control mesh, the portion 70 may not be recalculated for each individual edit. In some embodiments, the portion 70 is recalculated for each edit. In some embodiments, the portion 70 is recalculated only if no previously calculated and stored portion 70 is associated with the edited geometries. In this embodiment, because a third degree smoothing algorithm is used, portion 70 includes faces 40, 41, and 42 of smoothed section 60.

Figure 6A:
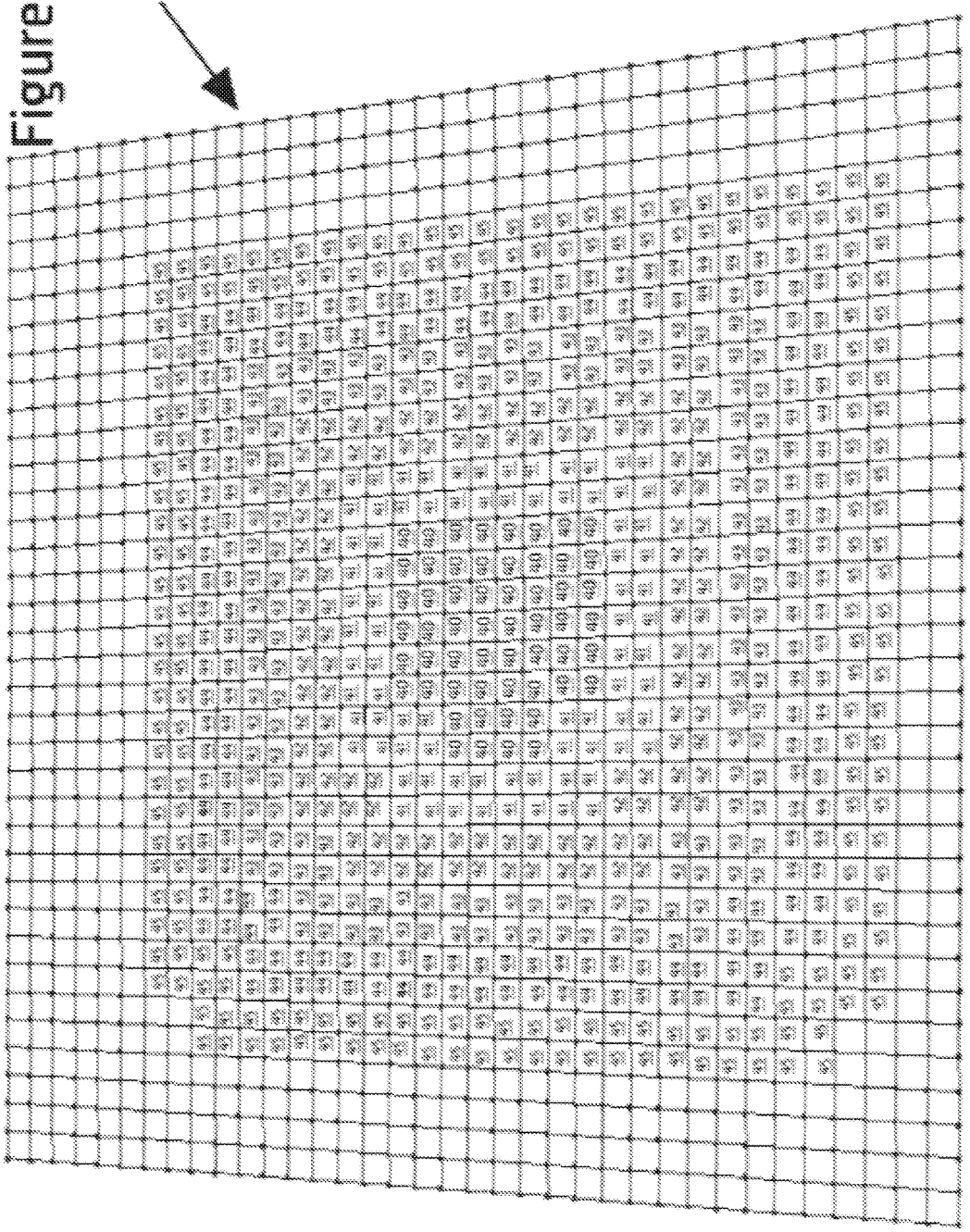

FIGS. 6A and 6B are smoothed versions 90A and 90B of control mesh 30A and 30B of FIGS. 4A and 4B, respectively. To generate the smoothed mesh 90B of FIG. 6B, the selected portion 70 of the smoothed section 60 is used to replace corresponding data in smoothed version 90A. Accordingly, faces labeled 40, 41, and 42 of the smoothed version 90A are replaced by selected portion 70. The remaining portions of the smoothed version 90A are not regenerated because they are not changed by the modification in the control mesh 30B.

The modification of vertex 5 in FIGS. 3A-3G and the modification of vertices 35 of FIG. 4 are examples of modifications which can be made. The aspects discussed apply to other modifications, as well. For example, the aspects may be applied for inserting one or more edges, moving one or more faces or edges, splitting a face, extruding a face or edge, or inserting a face.

The various aspects, processes, and actions discussed herein may be performed sequentially or in parallel. For example, a system capable of parallel processing may divide certain procedures among the available processing devices. In addition, the various aspects, processes, and actions may be performed automatically or algorithmically by the computer system according to a program running on the computer system.

While various aspects, processes, actions, and systems have been described as being included in the embodiments discussed, the various aspects, processes, actions, and systems can be practiced with certain modifications. For example, the sequential order of the various aspects, processes, and actions may be modified. In addition, certain aspects, processes, and actions may be omitted, and other aspects, processes, and actions may be added.

What is claimed is:

1. A computerized method of producing an electronic geometric model, the method comprising:
    with the computer, accessing electronic data, the data comprising polygonal data defining a control mesh of polygonal data points;
    with the computer, performing a smoothing algorithm on the control mesh to generate a smoothed mesh;
    with the computer, displaying the smoothed mesh;
    with the computer and in response to an indication from a user, wherein the indication indicates that a portion of the control mesh is to be modified:
        performing a smoothing algorithm on a determined portion of the control mesh to generate a smoothed section, wherein the smoothing algorithm is not performed on the control mesh outside the determined portion,
        modifying the smoothed mesh by replacing a portion of the smoothed mesh with the smoothed section; and
    displaying the modified smoothed mesh.

2. The method of claim 1, wherein the modified smoothed mesh is displayed in response to the indication.

3. The method of claim 1, wherein the determined portion of the control mesh includes all faces of the control mesh which are to be modified according to the indication.

4. The method of claim 1, wherein one or more faces of the control mesh which are included in the determined portion of the control mesh are included based on the included faces being within a determined number of faces from one or more faces of the control mesh which are to be modified according to the indication.

5. The method of claim 4, wherein the determined number is based on the degree of the smoothing algorithm.

6. The method of claim 5, wherein the smoothing algorithm is of nth degree and the determined number is equal to n.

7. The method of claim 5, wherein the smoothing algorithm is of nth degree and the determined number is equal to 2 times n.

8. The method of claim 4, wherein the determined number is based on continuity at a boundary of the replaced portion of the smoothed mesh.

9. The method of claim 1, wherein the determined portion of the control mesh includes all faces of the control mesh which correspond to the faces of the smoothed mesh which the smoothing algorithm is to modify.

10. The method of claim 1, further comprising storing the determined portion of the control mesh for another modification of the control mesh.

11. The method of claim 1, wherein determining the portion of the control mesh for smoothing comprises accessing a previously stored portion of the control mesh.

12. The method of claim 1, further comprising storing the smoothed section for another modification of the control mesh.

13. The method of claim 1, further comprises:
    selecting a portion of the smoothed section, the selected portion being a section of the smoothed section less than the entire smoothed section; and
    storing the selected portion of the smoothed section,
    wherein selecting the portion of the smoothed section comprises accessing a previously stored portion of the smoothed section.

14. The method of claim 13, wherein selecting the portion of the smoothed section comprises:

determining whether a portion of the smoothed section corresponding to the portion of the smoothed section to be modified is stored;

if a portion of the smoothed section corresponding to the portion of the smoothed section to be modified is stored, selecting the stored portion; and if a portion of the smoothed section corresponding to the portion of the smoothed section to be modified is not stored, calculating the portion of the smoothed section.

15. The method of claim 1, wherein one or more faces of the smoothed section which are included in the selected portion of the smoothed section are included based on the included faces being within a determined number of faces from the faces corresponding to the faces of the control mesh which are modified according to the indication.

16. The method of claim 15, wherein the determined number is based on the degree of the smoothing algorithm.

17. The method of claim 16, wherein the smoothing algorithm is of nth degree and the determined number is equal to n.

\* \* \* \* \*